(12) United States Patent
Hsieh

(10) Patent No.: US 11,196,389 B2
(45) Date of Patent: Dec. 7, 2021

(54) VARIABLE GAIN AMPLIFIER DEVICE

(71) Applicant: Realtek Semiconductor Corporation, Hsinchu (TW)

(72) Inventor: Yi-Chun Hsieh, Miaoli (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 103 days.

(21) Appl. No.: 16/804,139

(22) Filed: Feb. 28, 2020

(65) Prior Publication Data
US 2020/0403579 A1 Dec. 24, 2020

(30) Foreign Application Priority Data

Jun. 20, 2019 (TW) ................................ 108121562

(51) Int. Cl.
| | | |
|---|---|---|
| *H03F 3/45* | (2006.01) | |
| *H03F 1/30* | (2006.01) | |
| *H03F 3/04* | (2006.01) | |
| *H03G 3/30* | (2006.01) | |

(52) U.S. Cl.
CPC ................. *H03F 1/30* (2013.01); *H03F 3/04* (2013.01); *H03G 3/30* (2013.01); *H03F 2200/447* (2013.01); *H03G 2201/103* (2013.01)

(58) Field of Classification Search
CPC ........ H03F 3/45; H03F 2200/447; H03G 3/30
USPC .......................... 330/136, 254, 279, 256, 289
See application file for complete search history.

(56) References Cited

U.S. PATENT DOCUMENTS

2011/0133837 A1   6/2011  Komori
2019/0052236 A1*  2/2019  Sugimoto ............ H03G 1/0023

FOREIGN PATENT DOCUMENTS

TW           200822546 A    5/2008

* cited by examiner

*Primary Examiner* — Steven J Mottola
(74) *Attorney, Agent, or Firm* — Locke Lord LLP; Tim Tingkang Xia, Esq.

(57) ABSTRACT

A variable gain amplifier device includes a variable gain amplifier circuitry and a control voltage generating circuitry. The variable gain amplifier circuitry is configured to amplify input signals to generate output signals, wherein the variable gain amplifier circuitry includes a gain setting circuit that is configured to set a gain of the variable gain amplifier circuitry according to a control voltage. The control voltage generation circuitry is configured to simulate at least one circuit portion of the variable gain amplifier circuitry, in order to generate the control voltage according to the input signals and a setting voltage.

15 Claims, 3 Drawing Sheets

VARIABLE GAIN AMPLIFIER DEVICE

RELATED APPLICATION

The present application claims priority to Taiwan Application Serial Number 108121562, filed Jun. 20, 2019, which is incorporated herein by reference in its entirety.

BACKGROUND

Technical Field

The present disclosure relates to a variable gain amplifier device. More particularly, the present disclosure relates to a variable gain amplifier device capable of reducing temperature effects.

Description of Related Art

Variable gain amplifier is common in applications of transmitting and receiving signals, to amplify a received first signal to a second signal with appropriate amplitude, in order to facilitate the subsequent signal processing. However, in present technology, when the operating temperature changes, the gain of variable gain amplifier may have offset, such that the amplified second signal may have incorrect amplitude.

SUMMARY

In order to solve the problem mentioned above, one aspect of the present disclosure is to provide a variable gain amplifier device which includes a variable gain amplifier circuitry and a control voltage generation circuitry. The variable gain amplifier circuitry is configured to amplify input signals to generate output signals, in which the variable gain amplifier circuitry includes a gain setting circuit that is configured to set a gain of the variable gain amplifier circuitry according to a control voltage. The control voltage generation circuitry is configured to simulate at least one circuit portion of the variable gain amplifier circuitry, in order to generate the control voltage according to the input signals and a setting voltage.

Some aspects of the present disclosure provide an variable gain amplifier device which includes first transistors, a second transistor, a third transistor, a fourth transistor, and an amplifier. The first transistors are configured to generate a first output signal and a second output signal according to a first input signal and a second input signal. The second transistor is coupled to the first transistors at a first node and a second node, in which the second transistor is configured to receive a control voltage to set a gain. The third transistor is configured to receive a first reference signal. A first terminal of the fourth transistor is coupled to the third transistor. A first input terminal of the amplifier is configured to receive a second reference signal, a second input terminal of the amplifier is coupled to a second terminal of the fourth transistor, and an output terminal of the amplifier is coupled to a control terminal of the fourth transistor and configured to output the control voltage.

As described above, the variable gain amplifier device in some embodiments of the present disclosure can provide a fixed amplified gain at different operating temperatures.

BRIEF DESCRIPTION OF THE DRAWINGS

Accompanying drawings in the present disclosure are as follows.

DETAILED DESCRIPTION

All the terms used in this document generally have their ordinary meanings. The examples of using any terms discussed herein such as those defined in commonly used dictionaries are illustrative only, and should not limit the scope and meaning of the disclosure. Likewise, the present disclosure is not limited to some embodiments given in this document.

In this document, it may be understood that the terms "first," "second," and "third" are to describe the various elements, components, zones, levels and/or blocks. However, these elements, components, zones, levels and/or blocks should not be limited by these terms. These terms are used to distinguish one element, component, zone, level and/or block from another. For example, a first element, component, zone, level and/or block may be termed a second element, component, zone, level and/or block without departing from the scope of the present disclosure. As used herein, the term "and/or" includes any and all combinations of one or more of the associated listed items.

The term "coupled" or "connected" in this document may be used to indicate that two or more elements physically or electrically contact with each other, directly or indirectly. They may also be used to indicate that two or more elements cooperate or interact with each other.

In this document, the term "circuitry" may indicate a single system formed by one or more circuits. The term "circuit" may indicate objects formed with one or more transistors and/or one or more active/passive elements connected in a certain way, for processing signals.

Figure 1:
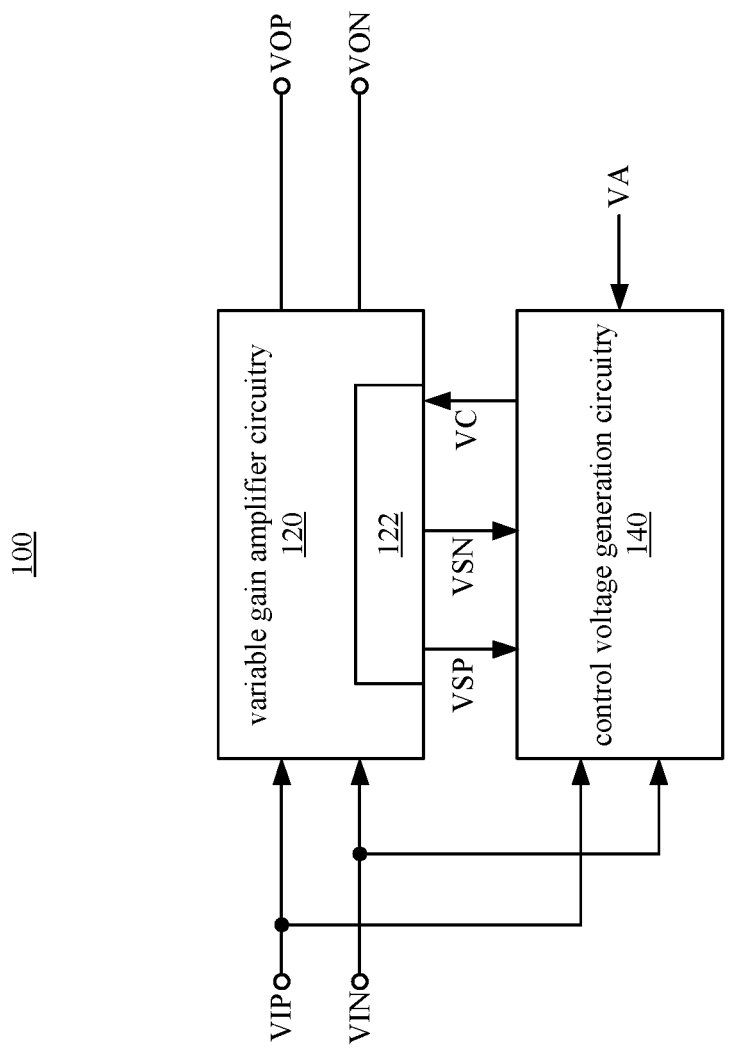
FIG. 1 is a schematic diagram of variable gain amplifier device, in accordance with some embodiments of the present disclosure.

Reference is now made to FIG. 1. FIG. 1 is a schematic diagram of a variable gain amplifier device 100 in accordance with some embodiments of the present disclosure. In some embodiments, the variable gain amplifier device 100 can be applied to transceiver circuit, mixed-signal processing circuit, etc., but the present disclosure is not limited thereto.

Variable gain amplifier device 100 includes a variable gain amplifier circuitry 120 and a control voltage generating circuitry 140. The variable gain amplifier circuitry 120 is configured to amplify an input signal VIP and an input signal VIN, to generate output signal VOP and output signal VON. In some embodiments, an input signal VIP and an input signal VIN can be referred to as a differential signal with specific data.

Variable gain amplifier circuitry 120 includes a gain setting circuit 122. The gain setting circuit 122 generates a specific element value (e.g., the resistance value described below) according to the control voltage VC, to set the gain of the variable gain amplifier circuitry 120. In some embodiments, the gain setting circuit 122 can be implemented by at least one of one or more impedance elements, capacitive elements, inductive elements or active elements.

Control voltage generating circuitry 140 is coupled to the variable gain amplifier circuitry 120. The control voltage generating circuitry 140 is configured to generate the above control voltage VC according to the input signals VIP and VIN, node voltages VSP and VSN associated with the gain setting circuit 122, and a setting voltage VA. In some embodiments, the node voltages VSP and VSN are generated by the nodes (e.g., the nodes NP and NN described below) coupled to the gain setting circuit 122.

In some embodiments, by setting the control voltage generating circuitry 140, the control voltage VC can be modified with operating temperature, such that the specific element value of the gain setting circuit 122 keeps fixed. In this way, the variable gain amplifier circuitry 120 can be ensured to keep a fixed amplified gain at different operating temperatures.

The paragraphs below will describe the embodiments of each circuit of variable gain amplifier device 100, but the present disclosure is not limited to the embodiments given below.

Figure 2:
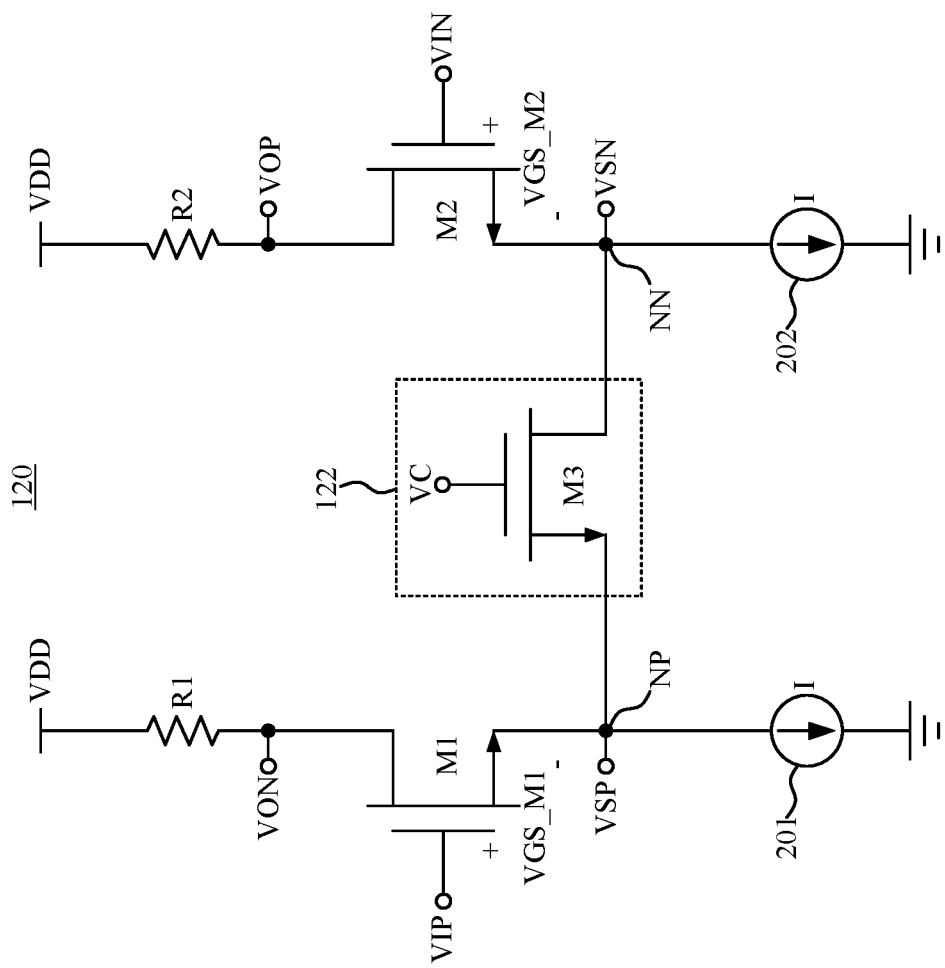
FIG. 2 is a schematic diagram of variable gain amplifier circuitry illustrated in FIG. 1, in accordance with some embodiments of the present disclosure.

Reference is now made to FIG. 2. FIG. 2 is a schematic diagram of variable gain amplifier circuitry 120 illustrated in FIG. 1, in accordance with various embodiments of the present disclosure. For ease of understanding, similar elements in FIGS. 1-2 will be designated with same reference numerals.

As shown in FIG. 2, variable gain amplifier circuitry 120 includes transistors M1-M3, resistors R1-R2, and current source circuits 201-202, in which the transistor M3 corresponds to the gain setting circuit 122 in FIG. 1.

Transistor M1 and transistor M2 are operated as an input pair circuit, and receive input signals VIP and VIN respectively. In detail, the first terminal of transistor M1 is coupled to a terminal of resistor R1 and generates output signal VON. The second terminal of transistor M1 is coupled to the node NP, and the control terminal of transistor M1 is configured to receive the input signal VIP. The first terminal of transistor M2 is coupled to a terminal of resistor R2 and generates a output signal VOP, the second terminal of transistor M2 is coupled to the node NN, and the control terminal of transistor M2 is configured to receive the input signal VIN.

The other terminal of resistor R1 and the other terminal of resistor R2 are configured to receive a voltage VDD. In some embodiments, resistors R1 and R2 can be implemented by transistor, semiconductor material layers, etc., but they are not limiting of the present disclosure.

Current source circuit 201 is coupled between the node NP and the ground, and is configured to provide a current I. Current source circuit 202 is coupled between the node NN and the ground, and is configured to provide the current I. In some embodiments, the current source circuits 201 and 202 can be implemented by a variety of current mirror circuits, but they are not limiting of the present disclosure.

Transistor M3 is coupled between the node NP and the node NN, and is configured to be operated as the gain setting circuit 122 in FIG. 1. Transistor M3 is configured to generate an equivalent resistance according to the control voltage VC, to set the gain of the variable gain amplifier circuitry 120. For example, if the control voltage VC is higher, the equivalent resistance is lower. Under the condition, the gain of the variable gain amplifier circuitry 120 is higher. On the other hand, if the control voltage VC is lower, the equivalent resistance is higher. Under the condition, the gain of the variable gain amplifier circuitry 120 is lower.

As shown is FIG. 2, two terminals (i.e. node NP and node NN) of transistor M3 respectively output a node voltage VSP and a node voltage VSN. The node voltage VSP and VSN can be derived as formula (1) below:

$$VSP = VIP - VGS\_M1$$

$$VSN = VIN - VGS\_M2 \quad (1).$$

VGS_M1 is a cross-over voltage between the control terminal and the second terminal of transistor M1, and VGS_M2 is a cross-over voltage between the control terminal and the second terminal of transistor M2. If the sizes of transistor M1 and M2 are the same and are operated in differential circuit, the two cross-over voltages VGS_M1 and VGS_M2 described above are substantially the same, which means VGS_M1≈VGS_M2. Under such a condition, the formula (2) below can be derived from formula (1):

$$\frac{VIP + VIN}{2} - VGS\_M1 = \frac{VSP + VSN}{2}. \quad (2)$$

In some embodiments, the control voltage generating circuitry 140 in FIG. 1 can be implemented according to formula (2), to generate the control voltage VC which can be modified with the operating temperature. In this way, amplification gain of the variable gain amplifier circuitry 120 can be fixed at different operating temperatures.

Figure 3:
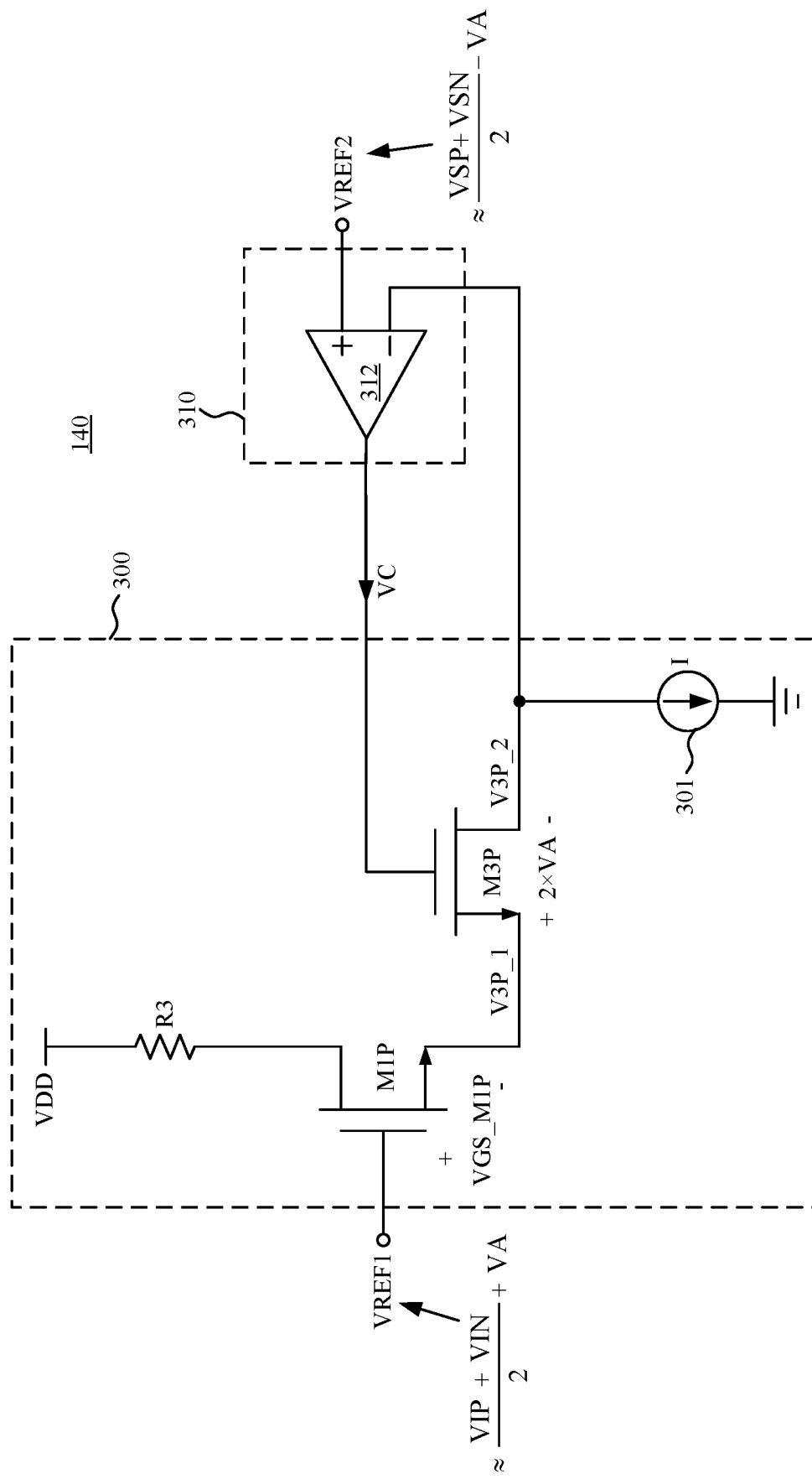
FIG. 3 is a schematic diagram of control voltage generating circuitry illustrated in FIG. 1, in accordance with some embodiments of the present disclosure.

Reference is now made to FIG. 3. FIG. 3 is a schematic diagram of the control voltage generating circuitry 140 illustrated in FIG. 1, in accordance with some embodiments of the present disclosure. For ease of understanding, similar elements in FIGS. 1-3 will be designated with same reference numerals.

The control voltage generating circuitry 140 includes a simulation circuit 300 and a feedback control circuit 310. The simulation circuit 300 is configured to simulate the connection of at least one circuit portion of the variable gain amplifier circuitry 120. In some embodiments, the at least one circuit portion described above includes gain setting circuit 122.

For example, the simulation circuit 300 includes a resistor R3, transistors M1P and M3P, and a current source circuit 301. Connections between the resistor R3, the transistors M1P and M3P, and the current source circuit 301 are configured to simulate connections of the resistor R1, the transistors M1 and M3, and the current source circuit 202 in FIG. 2. In detail, a terminal of resistor R3 is configured to receive the voltage VDD, and the other terminal of resistor R3 is coupled to the first terminal of transistor M1P. The second terminal of transistor M1P is coupled to the first terminal of the transistor M3P, and the control terminal of the transistor M1P is configured to receive a reference signal VREF1. The second terminal of the transistor M3P is coupled to the current source circuit 301, and the control terminal of the transistor M3P is configured to receive the control voltage VC.

In some embodiments, configurations of resistor R3, transistor M1P and M3P, and current source circuit 301, e.g., connection, resistance, size, current value, transistor type, etc., are the same as configurations of the resistor R1, the transistors M1 and M3, and the current source circuit 202 in FIG. 2. In some embodiments, circuit replica or other ways are used to implement the simulation circuit 300, but the present disclosure is not limited thereto.

Feedback control circuit 310 is configured to generate the control voltage VC according to the voltage V3P_2 on second terminal of the transistor M3P and the reference signal VREF2. In some embodiments, the feedback control circuit 310 includes an amplifier 312. The first input terminal of amplifier 312 receives a reference signal VREF2. The second input terminal of the amplifier 312 is coupled to the second terminal of the transistor M3P to receive the voltage V3P_2. Output terminal of the amplifier 312 is coupled to the transistor M3P, and configured to output the control voltage VC. Through feedback operation of the amplifier 312, the voltage V3P_2 on the second input terminal of the amplifier 312 would converge to be the same as the reference signal VREF2 received by the first input terminal of the amplifier 312.

In some embodiments, the reference signals VREF1 or VREF2 can be generated through the input signals VIP and VIN, the node voltages VSP and VSN associated with the gain setting circuit 122, and/or the setting voltage VA. For example, as shown in FIG. 2, the reference signal VREF1 and the reference signal VREF2 can be set separately as formula (3) shown below:

$$VREF1 \cong \frac{VIP + VIN}{2} + VA \qquad (3)$$
$$VREF2 \cong \frac{VSP + VSN}{2} - VA.$$

According to formula (3), the voltage V3P_1 on the first terminal of the transistor M3P can be derived as formula (4) shown below:

$$V3P\_1 = VREF1 - VGS\_M1P \qquad (4)$$
$$= \frac{VIP + VIN}{2} + VA - VGS\_M1P.$$

VGS_M1P is the cross-over voltage between the control terminal and the second terminal of transistor M1P. If the size of transistors M1 and M1P are the same, the cross-over voltages VGS_M1 and VGS_M1P are substantially the same, which means GS_M1≈VGS_M1P. Under such a condition, the voltage V3P_1 can be derived from formula (2) and formula (4) as formula (5) shown below:

$$V3P\_1 \cong \frac{VSP + VSN}{2} + VA. \qquad (5)$$

Accordingly, by formula (3) and formula (5), the voltage difference between the voltages V3P_1 and V3P_2 of two terminals of the transistor M3P can be derived as two times of the setting voltage VA, and accordingly, the equivalent resistance RM3P of the transistor M3P can be derived as formula (6) shown below:

$$V3P\_1 \cong \frac{VSP + VSN}{2} + VA \qquad (6)$$
$$V3P\_2 = VREF2 \cong \frac{VSP + VSN}{2} - VA$$
$$\rightarrow RM3P = \frac{V3P_1 - V3P_2}{I} = \frac{2 \times VA}{I}.$$

According to formula (6), the equivalent resistance value RM3P of the transistor M3P can be determined by two times of the setting voltage VA and the current I. Therefore, by the configuration described above, when the operating temperature changes, the control voltage VC would converge to a specific value based on the feedback control of the amplifier 312, such that the equivalent resistance value RM3P of transistor M3P complies with the formula (6) above. Accordingly, transistor M3 receiving the control voltage VC would also present the same equivalent resistance value RM3P. As a result, the variable gain amplifier device 100 can keep a fixed amplification gain at different operating temperatures.

In some embodiments, the control voltage generating circuitry 140 further includes one or more operation circuits (not shown), to generate the reference signals VREF1 and VREF2 as shown in formula (3), based on the input signals VIP and VIN, the node voltages VSP and VSN, and the setting voltage VA. For example, the control voltage generating circuitry 140 further includes at least one first operation circuit and at least one second operation circuit. The at least one first operation circuit is configured to generate an average value of the input signal VIP and VIN, and adds the average value and the setting voltage VA together to generate the reference signal VREF1. The at least one second operation circuit is configured to generate an average value of the node voltages VSP and VSN, and subtracts the voltage VA from the average value to generate the reference signal VREF2.

In some related technologies, a resistor divider circuit is used to generate a control voltage, to set the gain value of variable gain amplifier. In these technologies, when the operating temperature changes, the control voltage would change accordingly. In this way, the gain value of variable gain amplifier would also change.

Compare to the technologies described above, in some embodiments of the present disclosure, the control voltage VC can be modified to a specific value according to the operating temperature, to keep the gain value of variable gain amplifier fixed.

For ease of understanding, the figures described above are only illustrated by n-type transistors, while the present disclosure is not limited to the figures described above. Without departing from the spirit and scope of the present disclosure, each embodiment in the present disclosure can also be implemented by using p-type transistor, or a variety of types (p-type or n-type) or kinds (field effect transistor and/or bipolar transistor) of transistors in combination.

Based on the above, the variable gain amplifier device in the present disclosure can provide a fixed gain at different operating temperatures.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:
1. A variable gain amplifier device comprising:
  a variable gain amplifier circuitry configured to amplify input signals to generate a plurality of output signals, wherein the variable gain amplifier circuitry comprises a gain setting circuit that is configured to set a gain of the variable gain amplifier circuitry according to a control voltage; and
  a control voltage generation circuitry configured to simulate at least one circuit portion of the variable gain amplifier circuitry, in order to generate the control voltage according to the input signals and a setting voltage, wherein the control voltage generation circuitry comprises:

a simulation circuit configured to simulate the at least one circuit portion, and configured to generate a first voltage according to a first reference signal; and a feedback control circuit coupled to the simulation circuit, and configured to generate the control voltage according to a second reference signal and the first voltage.

2. The variable gain amplifier device of claim 1, wherein the control voltage generation circuitry is further configured to generate the control voltage according to the input signals, the setting voltage, and at least one node voltage, wherein the at least one node voltage is outputted from at least one node in the at least one circuit portion.

3. The variable gain amplifier device of claim 2, wherein the at least one circuit portion comprises the gain setting circuit, and the gain setting circuit is coupled to the at least one node.

4. The variable gain amplifier device of claim 1, wherein the first reference signal is generated according to the input signals and the setting voltage.

5. The variable gain amplifier device of claim 4, wherein the first reference signal is the sum of the setting voltage and an average value of the input signals.

6. The variable gain amplifier device of claim 1, wherein the second reference signal is generated according to the setting voltage and at least one node voltage associated with the at least one circuit portion.

7. The variable gain amplifier device of claim 6, wherein the second reference signal is the difference of the setting voltage and an average value of the at least one node voltage.

8. The variable gain amplifier device of claim 1, wherein the gain setting circuit is configured to provide an equivalent resistance to set the gain, and the equivalent resistance is determined according to twice the setting voltage.

9. A variable gain amplifier device comprising:

a plurality of first transistors configured to generate a first output signal and a second output signal according to a first input signal and a second input signal;

a second transistor coupled to the first transistors at a first node and a second node, wherein the second transistor is configured to receive a control voltage to set a gain;

a third transistor configured to receive a first reference signal;

a fourth transistor, wherein a first terminal of the fourth transistor is coupled to the third transistor; and an amplifier, wherein a first input terminal of the amplifier is configured to receive a second reference signal, a second input terminal of the amplifier is coupled to a second terminal of the fourth transistor, and an output terminal of the amplifier is coupled to a control terminal of the fourth transistor and configured to directly output the control voltage.

10. The variable gain amplifier device of claim 9, wherein an equivalent resistance of the third transistor is determined according to twice the setting voltage.

11. The variable gain amplifier device of claim 9, wherein the first reference signal is generated according to the input signals and a setting voltage.

12. The variable gain amplifier device of claim 11, wherein the first reference signal is the sum of the setting voltage and an average value of the input signals.

13. The variable gain amplifier device of claim 9, wherein the second reference signal is generated according to a first node voltage on the first node, a second node voltage on the second node, and a setting voltage.

14. The variable gain amplifier device of claim 13, wherein the second reference signal is the difference of the setting voltage and an average value of the at least one node voltage.

15. The variable gain amplifier device of claim 9, wherein a connection of the third transistor and the fourth transistor is set to be the same as a connection of one of the first transistors and the second transistor.

* * * * *